(12) United States Patent
Mahadeswaraswamy et al.

(10) Patent No.: US 8,880,227 B2
(45) Date of Patent: Nov. 4, 2014

(54) COMPONENT TEMPERATURE CONTROL BY COOLANT FLOW CONTROL AND HEATER DUTY CYCLE CONTROL

(75) Inventors: Chetan Mahadeswaraswamy, Sunnyvale, CA (US); Kartik Ramaswamy, San Jose, CA (US); Bryan Liao, Saratoga, CA (US); Sergio Shoji, San Jose, CA (US); Duy D. Nguyen, Milpitas, CA (US); Hamid Noorbakhsh, Fremont, CA (US); David Palagashvili, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 719 days.

(21) Appl. No.: 13/040,149

(22) Filed: Mar. 3, 2011

(65) Prior Publication Data
US 2012/0048467 A1   Mar. 1, 2012

Related U.S. Application Data

(60) Provisional application No. 61/349,073, filed on May 27, 2010.

(51) Int. Cl.
*G06F 19/00*   (2011.01)
*H01J 37/32*   (2006.01)
*H01L 21/67*   (2006.01)

(52) U.S. Cl.
CPC ..... *H01L 21/67248* (2013.01); *H01J 37/32908* (2013.01); *H01J 37/32724* (2013.01); *H01J 37/3299* (2013.01); *H01J 37/32522* (2013.01)
USPC ............................ 700/282; 118/697; 700/121

(58) Field of Classification Search
CPC .................... H01J 37/32522; H01J 37/32724; H01J 37/32908
USPC ............ 700/98, 121, 282; 156/345; 118/697, 118/708; 438/46; 165/200, 345.27
See application file for complete search history.

(56) References Cited

U.S. PATENT DOCUMENTS 6,026,986 A * 2/2000 Choi et al. ................. 222/64
6,635,117 B1 10/2003 Kinnard et al.
(Continued)

FOREIGN PATENT DOCUMENTS

| EP | 1770753 | 4/2007 |
|---|---|---|
| JP | 2005-79415 | 3/2005 |

(Continued)

OTHER PUBLICATIONS

Doug J. Cooper, "Integral Action and Pi Control", Controlguru Practical Process Control E-Textbook., 5 pages.

*Primary Examiner* — Kidest Bahta
(74) *Attorney, Agent, or Firm* — Blakely, Sokoloff, Taylor & Zafman, LLP

(57) ABSTRACT

Methods and systems for controlling temperatures in plasma processing chamber for a wide range of setpoint temperatures and reduced energy consumption. Temperature control is coordinated between a coolant liquid loop and a heat source by a control algorithm implemented by the plasma processing module controller. The control algorithm may completely stop the flow of coolant liquid to a temperature-controlled component in response to a feedback signal indicating an actual temperature is below the setpoint temperature. The control algorithm may further be based at least in part on a feedforward control signal derived from a plasma power or change in plasma power input into the processing chamber during process recipe execution.

21 Claims, 12 Drawing Sheets

(56) References Cited

U.S. PATENT DOCUMENTS

| | | | |
|---|---|---|---|
| 6,782,843 B2 | 8/2004 | Kinnard et al. | |
| 6,891,124 B2* | 5/2005 | Denton et al. | 219/121.54 |
| 6,921,724 B2* | 7/2005 | Kamp et al. | 438/715 |
| 7,069,984 B2* | 7/2006 | Jeong | 165/206 |
| 7,221,553 B2* | 5/2007 | Nguyen et al. | 361/234 |
| 2003/0205328 A1 | 11/2003 | Kinnard et al. | |
| 2006/0027324 A1 | 2/2006 | Makino et al. | |
| 2006/0269691 A1 | 11/2006 | Saki | |
| 2007/0091537 A1* | 4/2007 | Buchberger et al. | 361/234 |
| 2007/0091538 A1 | 4/2007 | Buchberger et al. | |
| 2008/0271471 A1* | 11/2008 | Nozawa et al. | 62/179 |
| 2009/0044752 A1 | 2/2009 | Furuya | |
| 2009/0183677 A1* | 7/2009 | Tian et al. | 118/667 |
| 2009/0294101 A1 | 12/2009 | Fovell et al. | |
| 2009/0310645 A1* | 12/2009 | Kofuji et al. | 374/12 |
| 2011/0186545 A1 | 8/2011 | Mahadeswaraswamy et al. | |

FOREIGN PATENT DOCUMENTS

| | | |
|---|---|---|
| JP | 2001-237226 | 12/2007 |
| JP | 2007-316039 | 12/2007 |
| KR | 10-2008-0107261 | 12/2008 |
| KR | 10-2009-0118839 | 11/2009 |

* cited by examiner

| Plasma Power Setpoint | Tsp = 60C | Tsp = 70C | Tsp = 80C | | | | TSP = 80C |
|---|---|---|---|---|---|---|---|
| 0 W (or idle condition) | | | | | | | |
| <= 1000 W | GAIN GROUP 1 | GAIN GROUP 2 | ⋮ | | | | |
| <= 2000 W | GAIN GROUP N | ⋮ | | | | | |
| ⋮ | ⋮ | | | | | | |
| <= 7000 W | | | | | | | |
| > 7000 W | | | | | | | |
| Spare | | | | | | | |

485 (columns), 486 (rows)

FIG. 4C

| Power/Temp | <-4500 | -4500 to -5499W | -3500 to -4499W | -2500 to -3499W | -1500 to -2499W | -500 to -1499W | -499 to 499W | 500 to 1499W | 1500 to 2499W | 2500 to 3499W | 3500 to 4499W | 4500 to 5499W | >5500W |
|---|---|---|---|---|---|---|---|---|---|---|---|---|---|
| <-45C | N | 1 | 1 | 1 | 1 | 1 | 1 | 1 | 1 | 1 | 1 | 1 | 1 |
| -36C to -45C | 1 | N | 1 | 1 | 1 | 1 | 1 | 1 | 1 | 1 | 1 | 1 | 1 |
| -26C to -35C | 1 | 1 | N | 1 | 1 | 1 | 1 | 1 | 1 | 1 | 1 | 1 | 1 |
| -16C to -25C | 1 | 1 | 1 | N | 1 | 1 | 1 | 1 | 1 | 1 | 1 | 1 | 1 |
| -6C to -15C | 1 | 1 | 1 | 1 | N | 1 | 1 | 1 | 1 | 1 | 1 | 1 | 1 |
| -5C to 5C | 1 | 1 | 1 | 1 | 1 | N | 1 | 1 | 1 | 1 | 1 | 1 | 1 |
| 6C to 15C | 1 | 1 | 1 | 1 | 1 | 1 | N | 1 | 1 | 1 | 1 | 1 | 1 |
| 16C to 25C | 1 | 1 | 1 | 1 | 1 | 1 | 1 | N | 1 | 1 | 1 | 1 | 1 |
| 26C to 35C | 1 | 1 | 1 | 1 | 1 | 1 | 1 | 1 | N | 1 | 1 | 1 | 1 |
| 36C to 45C | 1 | 1 | 1 | 1 | 1 | 1 | 1 | 1 | 1 | N | N | N | N |
| >45C | 1 | 1 | 1 | 1 | 1 | 1 | 1 | 1 | 1 | 1 | 1 | 1 | 1 |

COMPONENT TEMPERATURE CONTROL BY COOLANT FLOW CONTROL AND HEATER DUTY CYCLE CONTROL

CROSS-REFERENCE TO RELATED APPLICATIONS

This application claims the benefit of U.S. PROVISIONAL PATENT APPLICATION No. 61/349,073 filed May 27, 2010, and entitled "COMPONENT TEMPERATURE CONTROL BY COOLANT FLOW CONTROL AND HEATER DUTY CYCLE CONTROL," incorporated herein by reference in its entirety for all purposes.

BACKGROUND

1) Field

Embodiments of the present invention generally relate to plasma processing equipment, and more particularly to methods of controlling temperatures during processing of a workpiece with a plasma processing chamber.

2) Description of Related Art

In a plasma processing chamber, such as a plasma etch or plasma deposition chamber, the temperature of a chamber component is often an important parameter to control during a process. For example, a temperature of a substrate holder, commonly called a chuck or pedestal, may be controlled to heat/cool a workpiece to various controlled temperatures during the process recipe (e.g., to control an etch rate). Similarly, a temperature of a showerhead/upper electrode or other component may also be controlled during the process recipe to influence the processing. Conventionally, a heat sink and/or heat source is coupled to the processing chamber to control the temperature of a chamber component at a setpoint temperature. Typically, a first controller, such as a PID (proportional-integral-differential) controller is employed for feedback control of the heat transfer between the temperature-controlled component and a heat sink while a second controller is employed for feedback control of the heat transfer between the temperature-controlled component and a heat source. Each of the first and second controllers generally operate in isolation of the other, independently executing their own closed loop control algorithms, in essence providing two control loops which counter balance each other. Typically, a cooling control loop based on a liquid coolant operates with a nominal coolant liquid flow (e.g., ~1 GPM) at all times for the cooling loop to stay at a controlled steady state. As such, coolant liquid in the coolant lines is not allowed to stagnate within the coolant loop.

An effect of this conventional control configuration is that the control effort of each control loop needs to be approximately the same to neutralize an external disturbance quickly, such as an input of waste heat energy from a RF generator driving a plasma. When this external disturbance happens to be large, the control effort to neutralize the disturbance must be made correspondingly large. For example, a heat sink control loop must provide a large sink by operating at a very low temperature and/or having a large thermal mass, etc. However, during times when the external disturbances are much less, for example when a plasma processing system is in an idle state and there is no plasma power input to the system, the cooling effect of the large heat sink cannot be completely removed where a coolant loop maintains a nominal coolant flow. Instead, even during such idle times, the cooling effect is actively countered by the second controller via application of a significant amount of heating energy (e.g., 3000 W, or more) to maintain the setpoint temperature. In addition to this inefficiency, another effect of the conventional control configuration is that the upper limit of the component temperature is limited by the activity of the large heat sink. For example, even with application of 100% heating power, the effect of the large heat sink limits the maximum component temperature to a value less than what would be possible if the heat sink activity could be further reduced. For a similar reason, the transient response to increases in the setpoint temperature is also slow. The end result of the convention configuration is energy inefficient system operation with limited processing temperature range and increased transient response times.

SUMMARY

Methods and systems for controlling a process or chamber component temperature as a plasma process is executed by plasma processing apparatus are described herein. In certain embodiments, methods and systems coordinate heat transfer between the process chamber and both a heat sink and a heat source. In a particular embodiment, methods and systems coordinate coolant liquid flow control and heater duty cycle control to reduce the amount of energy required to maintain a setpoint temperature in absence of an external disturbance while still achieving a fast control response to neutralize an external disturbance.

Certain embodiments include a method whereby a temperature in the process chamber is controlled at a chamber management level rather than at the level of an individual heat sink or source. In further embodiments the chamber management level control is based, at least in part, on a feedback signal indicating an error between the chamber component temperature and a setpoint temperature. When the component temperature is below the setpoint temperature, both a heating power input to heat the chamber component may be increase and a coolant liquid flow between the process chamber and a heat sink external to the process chamber may be reduced to a flow rate of zero in response to the feedback signal.

In an embodiment, one or more of the coolant liquid flow and a heater power controlling the component temperature is further determined with a feedforward control signal based on a plasma power input to the process chamber when the chamber is in an active state executing a plasma process recipe. In particular embodiments, a transfer function of an input plasma power signal is to compensate a heating of the process chamber component by the plasma power output by the power source. In certain such embodiments, the coolant liquid flow and the heating power control includes applying a first group of gain values during a first portion of an executing step in a plasma process recipe, the first group of gain values associated with a plasma input power and the setpoint temperature for the executing recipe step. A second group of gain values may further be applied during a second portion of the executing recipe step, the second group of gain values associated with a change in the plasma input power and a change in the setpoint temperature between the executing step and a preceding or subsequent plasma process recipe step.

Embodiments include a computer readable media storing instructions which when executed by a processing system cause the processing system to coordinate heat transfer between the process chamber and both a heat sink and a heat source. In one such embodiment, computer readable media stores instructions to coordinate coolant liquid flow control and heater duty cycle control to reduce the amount of energy required to maintain a setpoint temperature in absence of an external disturbance while still achieving a fast control response to neutralize an external disturbance. In particular embodiments, the computer readable media includes a transfer function between the plasma power signal and the component temperature and further includes instructions to compensate a heating of the process chamber component by the plasma power output.

Embodiments include a plasma processing chamber, such as a plasma etch or plasma deposition system, having a temperature-controlled component to be coupled to a heat sink/heat source. The temperature-controlled component may be coupled to a heat sink by a coolant liquid loop including a coolant liquid control valve which completely stops the coolant liquid flow to the temperature-controlled component. The chamber may further include a temperature controller coupled to the coolant liquid control valve to control a heat transfer between the temperature-controlled component and the heat sink by varying the coolant liquid flow rate over a range including zero liquid flow.

A plasma power source is to be coupled to the processing chamber to energize a plasma during processing of a workpiece disposed in the process chamber. The temperature controller may coordinate control of heat transfer between the temperature-controlled component and both a heat sink and a heat source by way of a feedback control signal and/or a feedforward control signal based on a plasma power input to the chamber to compensate a plasma heating of the temperature-controlled component. In one such embodiment, the temperature-controlled component comprises a process gas showerhead configured to deliver process gas during plasma processing.

BRIEF DESCRIPTION OF THE DRAWINGS

Embodiments of the invention are particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

FIG. 4C illustrates a gain group lookup table, in accordance with an embodiment of the present invention;

FIG. 4E illustrates a lookup table for a gain group employed by the control algorithm of FIG. 4D, in accordance with an embodiment of the present invention.

DETAILED DESCRIPTION

Figure 1:
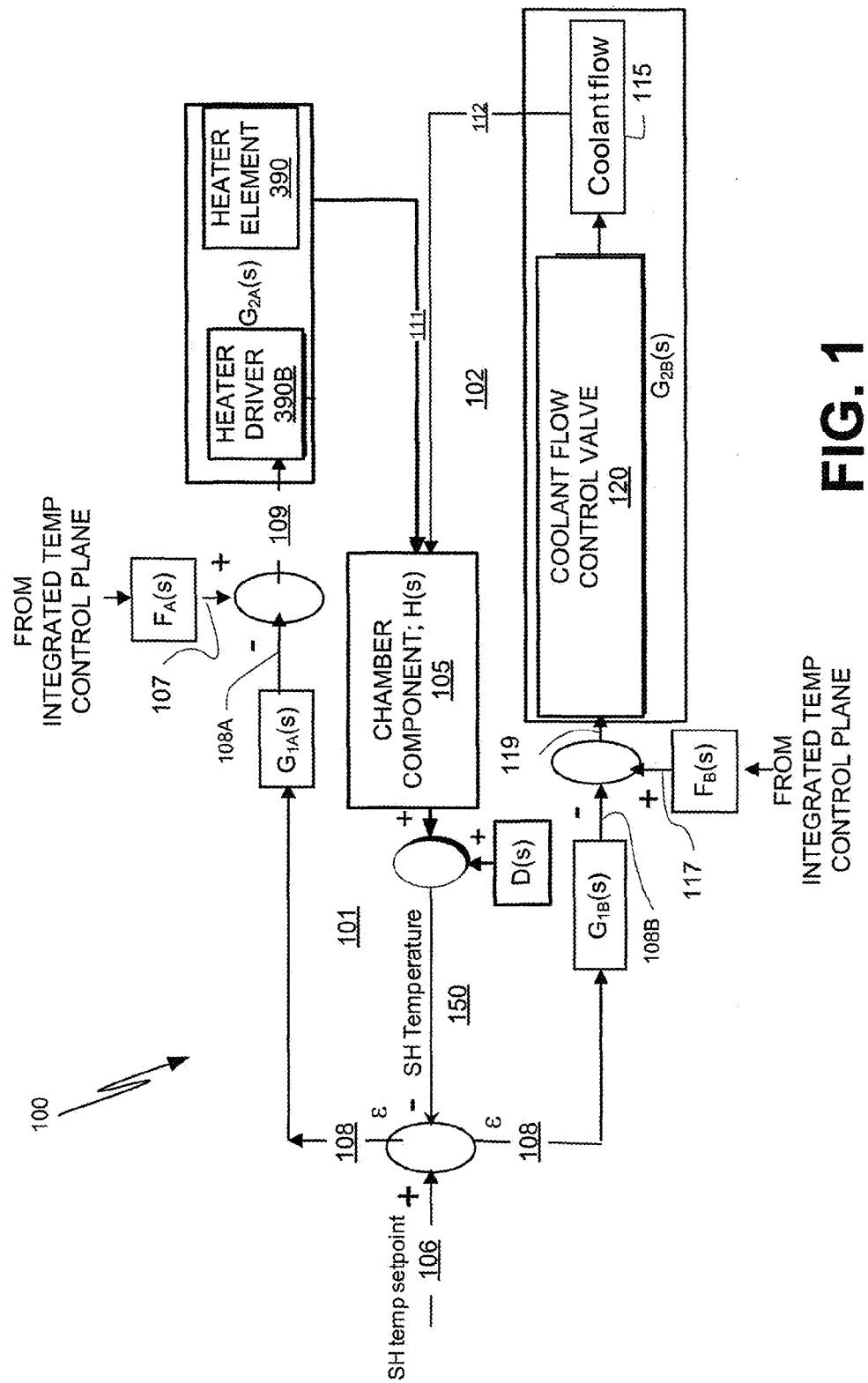
FIG. 1 is a block diagram illustrating a temperature control system including both feedforward and feedback control elements and providing a coordinate control effort responsive to both heating and cooling, in accordance with an embodiment of the present invention.

In the following detailed description, numerous specific details are set forth in order to provide a thorough understanding of embodiments of the invention. However, it will be understood by those skilled in the art that other embodiments may be practiced without these specific details. In other instances, well-known methods, procedures, components and circuits have not been described in detail so as not to obscure the present invention. Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm or method is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, levels, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD- ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

Embodiments of methods and systems for controlling a process or chamber component temperature described herein provide a temperature control effort including both a cooling control loop and a heating control loop in which a coolant liquid flow control and heater control are coordinated to reduce the amount of energy required to maintain a setpoint temperature in absence of an external disturbance while still achieving a fast control response to neutralize an external disturbance. Generally, a plasma process chamber (module) controller provides a level of temperature control above the conventional independent heat sink/heat source controllers. The chamber level controller executes a temperature control algorithm and communicates control parameters, such as feedback and/or feedforward gain values to one or more of the heat sink/heat source controllers to effect control of the coolant liquid flow control and heater duty cycle.

By moving control computations for the feedback and/or feedforward transfer function off an autonomous temperature control plane (e.g., a discrete PID controller of a heat sink or heat source) and onto an integrated control software plane of the plasma processing system which may compute both the feedback and feedforward control efforts, the discrete temperature controllers of the separate heating and cooling loops may then be utilized in a coordinated manner more efficiently. One or more of the discrete temperature controllers may operate in a manual mode merely as a driver of the control actuators (e.g., valves, resistive elements, etc.) operating under the direction of the integrated plasma chamber control software plane executing instructions implementing the temperature control system 100 depicted in FIG. 1. In alternative embodiments however, at least one discrete temperature controller is configured to operate in an automatic closed loop mode and provide either or both of the feedback and feedforward control described herein with the associated control computations off-loaded from the integrated control software plane. For embodiments where one discrete temperature controller (e.g., providing a heat source) is in automatic mode, the integrated temperature control software plane may provide directions to a second discrete temperature controller (e.g., providing a heat sink) that is operating in manual mode. In either implementation, with the higher level of temperature control provided by the integrated temperature control software plane, the cooling power, for example, may be greatly reduced when an external temperature disturbance is absent (e.g., during idle time). Also, transition response times may be reduced, for example upon a change in setpoint temperature during active recipe execution or idle time. This effect is achieved in certain embodiments by completely stopping a coolant liquid flow to the temperature-controlled component to greatly reduce the cooling power and to allow relatively smaller amounts of heating power neutralize the component temperature error when a feedback signal indicates the component temperature is less than a setpoint temperature. With the integrated temperature control software plane providing the ability to conditionally stop the coolant liquid flow to a chamber component, higher component setpoint temperatures may also be achieved for a given heating power.

FIG. 1 is a block diagram illustrating a temperature control system 100 including both feedforward and feedback control elements coordinating heating and cooling control efforts 111, 112 responsive to both heating and cooling disturbances, in accordance with an embodiment of the present invention. As shown, the system 100 includes a heat source control loop 101 and a heat sink control loop 102 affecting the temperature of a component 105. The heat source control loop 101 includes a heater 390 which may be controlled by the based on a feedback control signal 108A. For exemplary embodiments which compute a control effort based in part on a plasma power input into the plasma processing chamber, the control system 100 further provides a feedforward control signal 107 via the integrated control software plane because commercially available temperature controllers lack a feedforward input for disturbance compensation (e.g., instead providing only for a feedback control with inputs including a measured controlled temperature 150 and setpoint temperature 106). The control signal 109 sent to the heater driver 390B therefore may be a function (e.g., summation) of both the feedback control signal 108A and feedforward control signal 107 with an error gain and a power gain applied to the signals 108A and 107, respectively.

Similarly, the heat sink control loop 102 includes a coolant liquid flow 115 which may be controlled based on a feedback control signal 108B. For exemplary embodiments which compute a control effort based in part on a plasma power input into the plasma processing chamber, the control system 100 further provides a feedforward control signal 117 via the integrated control software plane. The control signal 119 sent to a coolant liquid control valve(s) 120 therefore may be a function (e.g., summation) of both the feedback control signal 108B and feedforward control signal 117 with an error gain and a power gain applied to the signals 108B and 117, respectively.

The temperature control system 100 includes at least one feedforward transfer function $F_A(s)$, and/or $F_B(s)$ which takes, as an input, a plasma power introduced into the plasma process chamber during processing of a workpiece. In one such embodiment, the plasma power is a weighted sum of multiple power inputs to the processing chamber. For example, in one embodiment a weighted sum of Plasma Power equals $c1*P1+c2*P2+c3*P3$, where P1, P2 and P3 are the bias and/or source powers. The weights c1, c2, and c3 may be any real number, and are typically positive although in certain embodiments, a weight of a source power is negative where component heating is actually reduced with an increase in source power.

The plasma power input into the feedforward line may be based on any power output by a plasma power source, such as an RF generator, magnetron, etc., that places an appreciable heat load on the temperature controlled system component. The feedforward transfer function $F_A(s)$, and/or $F_B(s)$ is to provide a control effort opposite in sign to the disturbance transfer function D(s) and compensate an increase in the controlled temperature 150 resulting from the disturbance caused by the plasma source power heat load. The disturbance transfer function D(s) relates a heat load of the plasma power to a rise in the controlled temperature 150 of the plasma processing chamber component having a particular thermal time constant, π. For example, a step function increase in a plasma power from 0 W to 1000 W at time t may be mapped by the disturbance transfer function D(s) to a component temperature rise over time. The feedforward control signals 107, 117 are coupled with a feedback transfer function $G_{1A}(s)$ and/or $G_{1B}(s)$ providing the feedback control signal 108 for correction of an error signal εε corresponding to a difference between the controlled temperature 150 and the setpoint temperature 106.

The feedforward control signals 107, 117 along with the setpoint temperature 106, is input to an actuator transfer function $G_{2A}(s)$, $G_{2B}(S)$ and a thermal mass transfer function H(s) to compensate the effect of the disturbance transfer function D(s) on the output controlled temperature 150. The thermal mass transfer function H(s) includes a function of the heat capacities of the heat sink/source and the temperature-controlled component, etc. The actuator transfer function $G_{2B}(s)$ includes a function of an actuator controlling a heat transfer between the temperature-controlled component 105 and a heat sink (e.g., chiller) and a function of the coolant flow. The illustrated embodiment further includes a function ($G_{2A}(s)$) of an actuator controlling a heat transfer between the temperature-controlled component 105 and a heat source (e.g., heater element 390 and heater driver 390B). The feedforward transfer function $F_A(s)$ (or $F_B(s)$) may be implemented with the same actuator as a conventional feedback control system which may already be fitted to an independent closed loop control system, such as a coolant liquid loop. An actuator may be implemented in any manner commonly employed in the art. For the exemplary coolant liquid loop embodiment, an actuator includes one or more valve(s) 120 controlling the coolant liquid flow 115 coupled between the temperature-controlled component 105 and a heat sink (e.g., chiller 377). In a further embodiment, another actuator includes one or more resistive heating element drive power switches (390B) coupled to the temperature-controlled component 105.

Figure 2A:
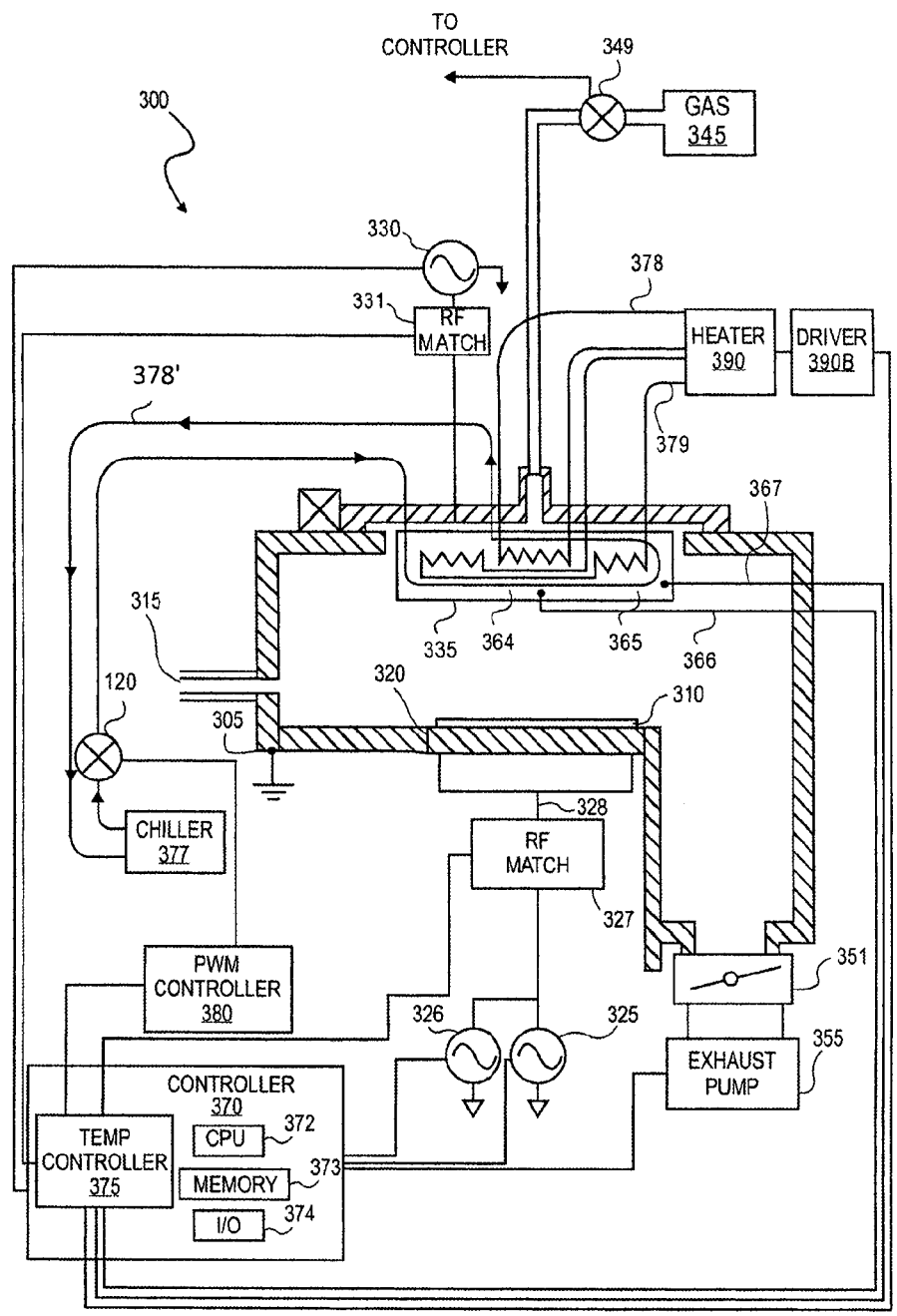
FIG. 2A illustrates a schematic of a plasma etch system including a temperature controller, in accordance with an embodiment of the present invention.

FIG. 2A illustrates a schematic of a plasma etch system including a temperature controller, in accordance with an embodiment of the present invention. The plasma etch system 300 may be any type of high performance etch chamber known in the art, such as, but not limited to, Enabler™, MxP®, MxP+™, Super-E™, DPS II AdvantEdge™ G3, or E-MAX® chambers manufactured by Applied Materials of CA, USA. Other commercially available etch chambers may be similarly controlled. While the exemplary embodiments are described in the context of the plasma etch system 300, it should be further noted that the temperature control system architecture described herein is also adaptable to other plasma processing systems (e.g., plasma deposition systems, etc.) which present a heat load on a temperature-controlled component.

The plasma etch system 300 includes a grounded chamber 305. A substrate 310 is loaded through an opening 315 and clamped to a chuck 320. The substrate 310 may be any workpiece conventionally employed in the plasma processing art and the present invention is not limited in this respect. The plasma etch system 300 includes a temperature controlled process gas showerhead 335. In the exemplary embodiment depicted, the process gas showerhead 335 includes a plurality of zones 364 (center) and 365 (edge), each zone independently controllable to a setpoint temperature 106 (FIG. 1). Other embodiments have either one zone or more than two zones. For embodiments with more than one zone, there are n heater zones and m coolant zones where n need not be equal to m. For example, in the embodiment depicted, a single cooling loop (m=1) passes through two heater zones (n=2). Process gases, are supplied from gas source 345 through a mass flow controller 349, through the showerhead 335 and into the interior of the chamber 305. Chamber 305 is evacuated via an exhaust valve 351 connected to a high capacity vacuum pump stack 355.

When plasma power is applied to the chamber 305, a plasma is formed in a processing region over substrate 310. A plasma bias power 325 is coupled to the chuck 320 (e.g., cathode) to energize the plasma. The plasma bias power 325 typically has a low frequency between about 2 MHz to 60 MHz, and in a particular embodiment, is in the 13.56 MHz band. In the exemplary embodiment, the plasma etch system 300 includes a second plasma bias power 326 operating at about the 2 MHz band which is connected to the same RF match 327 as plasma bias power 325. A plasma source power 330 is coupled through a match 331 to a plasma generating element to provide high frequency source power to inductively or capacitively energize the plasma. The plasma source power 330 typically has a higher frequency than the plasma bias power 325, such as between 100 and 180 MHz, and in a particular embodiment, is in the 162 MHz band. Notably, the system component to be temperature controlled by the control system 100 is neither limited to the showerhead 335 or chuck 320 nor must the temperature-controlled component directly couple a plasma power into the process chamber. For example, chamber liner may be temperature controlled in the manner described herein and a temperature controlled showerhead may or may not function as an RF electrode.

In the exemplary embodiment, the temperature controller 375, as the integrated temperature control software plane of the system controller 370, is to execute at least a portion of the temperature control algorithms described herein. As such, the temperature controller 375 may be either software or hardware or a combination of both software and hardware. The temperature controller 375 is to output control signals affecting the rate of heat transfer between the showerhead 335 and a heat source and/or heat sink external to the plasma chamber 305. In the exemplary embodiment, the temperature controller 375 is coupled, either directly or indirectly, to the chiller 377 and the heater element 390. A difference between the temperature of the chiller 377 and the setpoint temperature 106 may be input into the feedforward control line along with the plasma power.

The chiller 377 is to provide a cooling power to the showerhead 335 via a coolant loop 376 thermally coupling the showerhead 335 with the chiller 377. In the exemplary embodiment, one coolant loop 376 is employed which passes a cold liquid (e.g., 50% ethylene glycol at a setpoint temperature of −15° C.) through a coolant channel embedded in both the inner zone 364 and outer zone 365 (e.g., entering proximate to a first zone and exiting proximate to the other zone) of the showerhead 335. The ability to have such low coolant setpoint temperatures is a benefit of the pulsed cooling control system described herein over conventional systems which must maintain a minimum coolant flow rate (e.g., 0.8 GPM) to avoid fluid stagnation even under low/no plasma power conditions. To ensure no more heat is extracted than the heat source can provide under low/no plasma power conditions, the minimum coolant setpoint temperature is limited by this non-zero minimum flow rate. With the pulsed cooling control system, however, because the duty cycle of coolant may be set to very low percentage, even 0% under idle control, the coolant sink is enabled to operate at a lower setpoint for increased sink capacity.

The temperature controller 375 is coupled to a coolant liquid pulse width modulation (PWM) driver 380. The coolant liquid PWM driver 380 may be of any type commonly available and configurable to operate the valve(s) 120 for embodiments where those valves are digital (i.e., having binary states; either fully open or fully closed) at a duty cycle dependent on control signals sent by the temperature controller 375. For example, the PWM signal can be produced by a digital output port of a computer (e.g., controller 370) and that signal can be used to drive a relay that controls the valves to on/off positions. Alternatively, as further depicted by FIG. 2B, a heater controller 391 which supports PWM functionality and provides for external drive of a commanded duty cycle thereby also providing at least some of the functionality of the coolant liquid PWM driver 380 and negating the need for two separate PWM interfaces. In still other embodiments, analog valves providing an infinitely variable flow rate from 0 to a maximum flow rate are utilized with the valve open positions controlled by the temperature controller 375.

For the exemplary embodiment depicted in FIG. 2A, the heater element 390 depicted in FIG. 1 includes first and second electrical resistive heating elements 378, 379. The heating elements 378, 379 may be independently driven based on one or more temperature sensors 366 and 367 (e.g., an optical probe in each of the inner and outer zones 364, 365). The heater driver 390B may be a solid state relay or a semiconductor controlled rectifier (SCR), for example. The heater controller 391 provides PWM functionality analogous to, or in place of, coolant liquid PWM driver 380 to interface the temperature controller 375 with either or both of the heater element(s) 378, 379 and the coolant loop 376. For example, units commercially available from Watlow Electric Manufacturing Company, USA or Azbil/Yamatake, Japan, may be employed as the heater controller 391 and/or coolant liquid PWM driver 380.

Figure 2B:
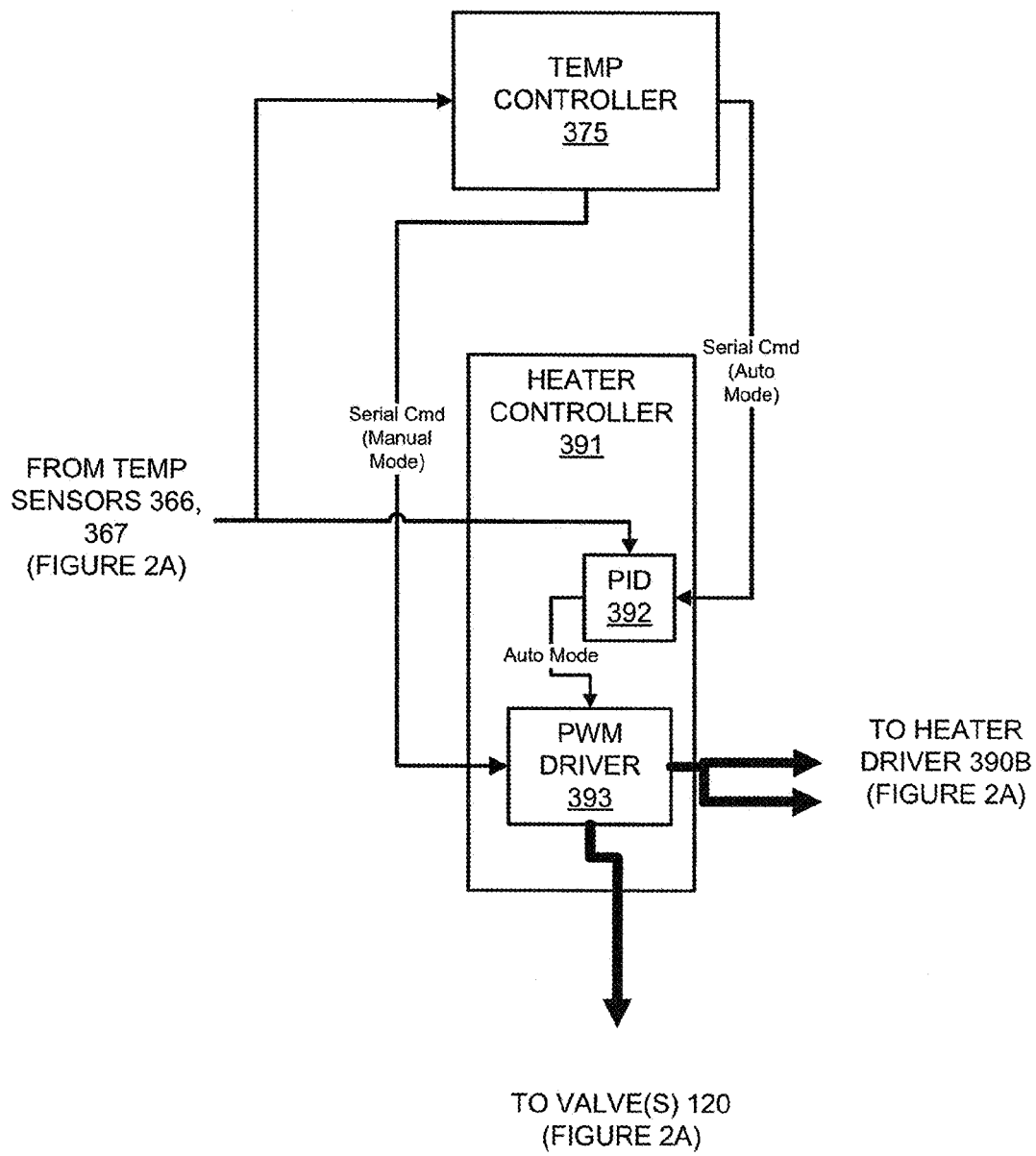
FIG. 2B illustrates a block diagram of a components in a temperature control chain, in accordance with an embodiment of the present invention.

Referring to FIG. 2B, in a manual mode, duty cycle control commands are sent (e.g., serially) by the temperature controller 375 to the heater controller 391. The heater controller 391, via the PWM driver 393, outputs a square wave at the prescribed duty cycle to the heater driver 390B. Reference to "manual mode" is with respect to the heater controller 391 being in an open loop with the temperature controller 375 sending control commands to the heater controller 391 for automatic control of heater power. For analog embodiments, an analog signal may be sent to the heater driver 390B which would turn on/off the heater element(s) at an appropriate AC phase, for example at zero crossing. For the exemplary embodiment with two heater zones, two channels of the heater controller 391 are output to the heater driver 390B for elements 378, 379. In a further embodiment, where the heater controller 391 also provides the functionality of the liquid coolant PWM driver 380, one or more channels (e.g., a third channel) from the heater controller 391 is output to operate the coolant valve(s) 120 (e.g., switch the valve(s) 120 on/off via an electronic to pneumatic transducer). As such, when cooling is required, the valve(s) 120 may be opened (e.g., duty cycle increased) and when heating is required, the valve(s) 120 may be closed (e.g., duty cycle decreased) and resistive heating elements 378 and/or 379 driven. As described elsewhere herein, this "manual mode" may be utilized to control a component temperature during an active recipe step at the process recipe control level via the temperature controller 375.

In an automatic control mode, heater controller 391 provides the functionality of an independent/closed loop PID controller, via PID 392, which operates the heaters based on the temperature information received directly (e.g., via temperature sensors 366, 367), the setpoint temperature (e.g., from recipe file), and further based on gain values received from the temperature controller 375. In an embodiment, the automatic control operates the heater 390 during an idle mode, as described elsewhere herein. Whether the heater controller 391 is in automatic or manual control mode however, for embodiments where the heater controller 391 further interfaces the temperature controller 375 with the coolant loop valve(s) 120, the coolant duty cycle is preferably determined by the temperature controller 375 and not the heater controller 391.

Notably, the temperature controller 375 need not be contained within, or provided by, the integrated process chamber control software plane of the system controller 370. Specifically, the functionality of temperature controller 375 may be instead provided as discrete system. For example, PID controllers, such as, but not limited to those commercially available from Watlow Electric Manufacturing Company or Azbil of Yamatake Corp., may be designed to include additional feedforward inputs, such as the plasma power. The discrete system may further be manufactured to include a processor having the ability to determine a feedforward control effort based on those feedforward inputs. As such, all the embodiments described herein for temperature control may be provided either by the temperature controller 375 as a facet of an integrated process chamber control software plane or as a component of the PWM driver 380 and/or heater controller 391.

Figure 3A:
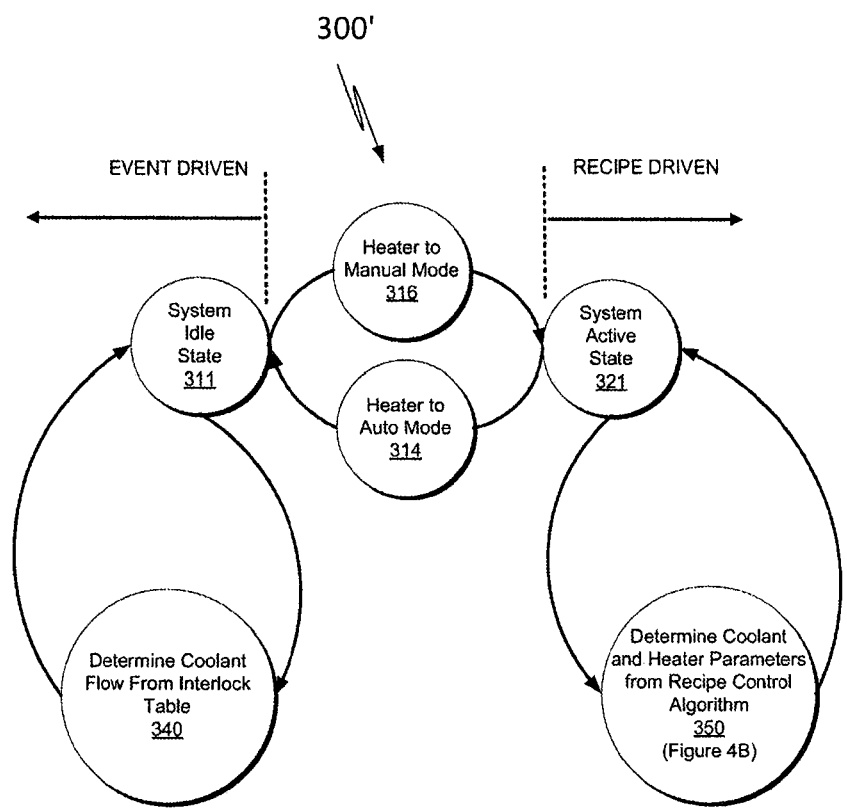
FIG. 3A is a state diagram illustrating control loop configurations for an idle state and an active state of a plasma processing chamber, in accordance with an embodiment of the present invention.

In an embodiment, to reduce the cooling power during system idle time (i.e., when no plasma processing is occurring in the chamber 305) the temperature controller 375 maintains control over the cooling loop 101 during both an idle state (e.g., no substrate processing being performed by chamber) and an active state (e.g., substrate processing being performed). FIG. 3A is a state diagram 300' illustrating control loop configurations for an idle state 311 and an active state 321 of a plasma processing chamber, in accordance with an embodiment of the present invention. As shown, while in the idle state 311, the system operates in an event driven mode during which interlocks 340 may be triggered upon the occurrence of events defined in an interlock table. In an embodiment, the coolant liquid flow is determined based on corresponding temperature threshold values of the component 105 (e.g., showerhead 335) defined in the interlock table illustrated in FIG. 4A.

Figure 4A:
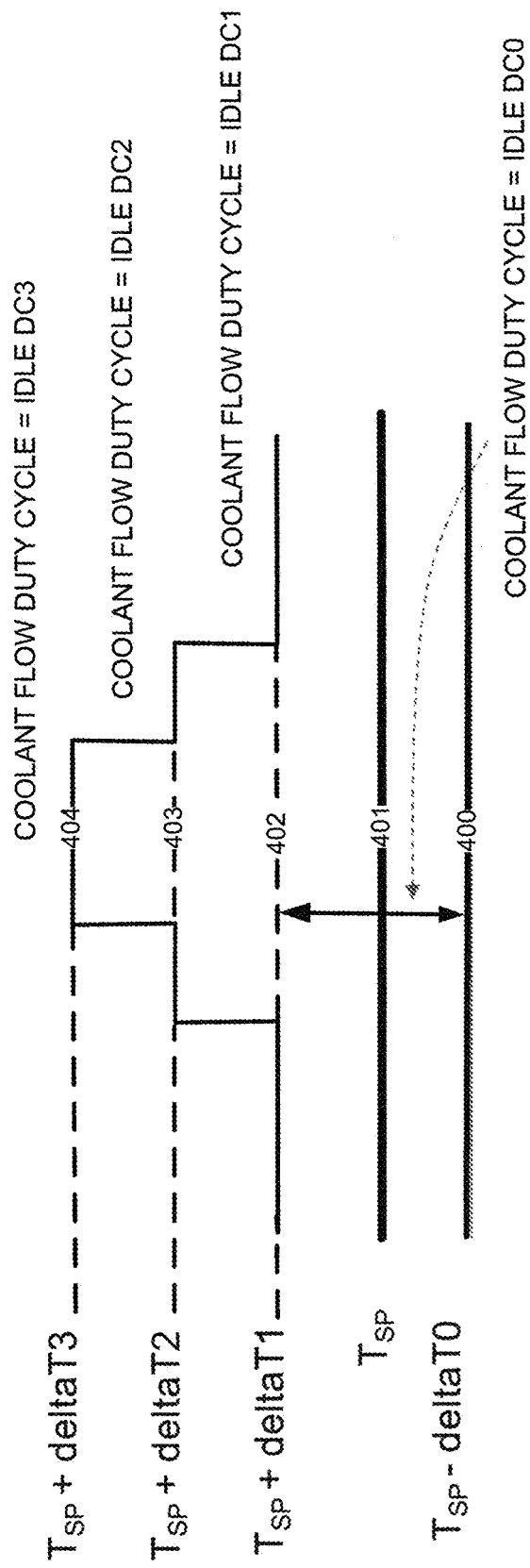
FIG. 4A illustrates an event driven control algorithm for controlling a component temperature with the control system described in FIG. 1 during an idle state, in accordance with an embodiment of the present invention.

FIG. 4A illustrates an event driven control algorithm for controlling a component temperature during an idle state. As shown, in response to a feedback signal indicating the chamber component temperature is below a setpoint temperature 401 ($T_{SP}$) the coolant liquid flow into the temperature-controlled component (e.g., showerhead 335) is set to a first duty cycle (IDLE DC0). In a particular embodiment, this first duty cycle IDLE DC0 reduces the coolant liquid flow rate to zero to completely stop the flow to the component if the temperature is below the threshold 402 ($T_{SP}$+delta T1). Upon crossing the thresholds 402, 403 and 404, the duty cycle is changed to IDLE DC1, DC2, DC3, etc., depending on the temperature rising or falling. As such, if a setpoint temperature is raised during the idle state 311 (e.g., in preparation for another process), the coolant flow is stopped and heater power (e.g., operating in automatic mode) has a faster effect and higher setpoint temperatures may be achieved.

In the particular embodiment depicted in FIG. 3A, when the system moves into the idle state 311 from an active state 321, the heater 390 is placed into an automatic, closed loop mode 314. For such an embodiment, the heater controller (e.g., PID 392 of FIG. 2B) seeks to achieve the setpoint temperature 106 by driving the heating elements as needed while the temperature controller 375 sends control commands for the valve(s) 120 to the PWM driver 393 to close the heat sink control loop 102 with a feedback signal. As further depicted in FIG. 3A, when the system moves into the active state 321 from the idle state 311, the heater 390 is placed into the manual mode 316. For such an embodiment, duty cycles for both heater power and valve(s) 120 are determined by the temperature controller 375 to close the both the heat sink control loop 102 and heat source control loop 101 with a feedback and/or a feedforward signal. Notably, however, in either active or idle states, the controller 375 preferably determines the duty cycle for the liquid coolant.

Figure 3B:
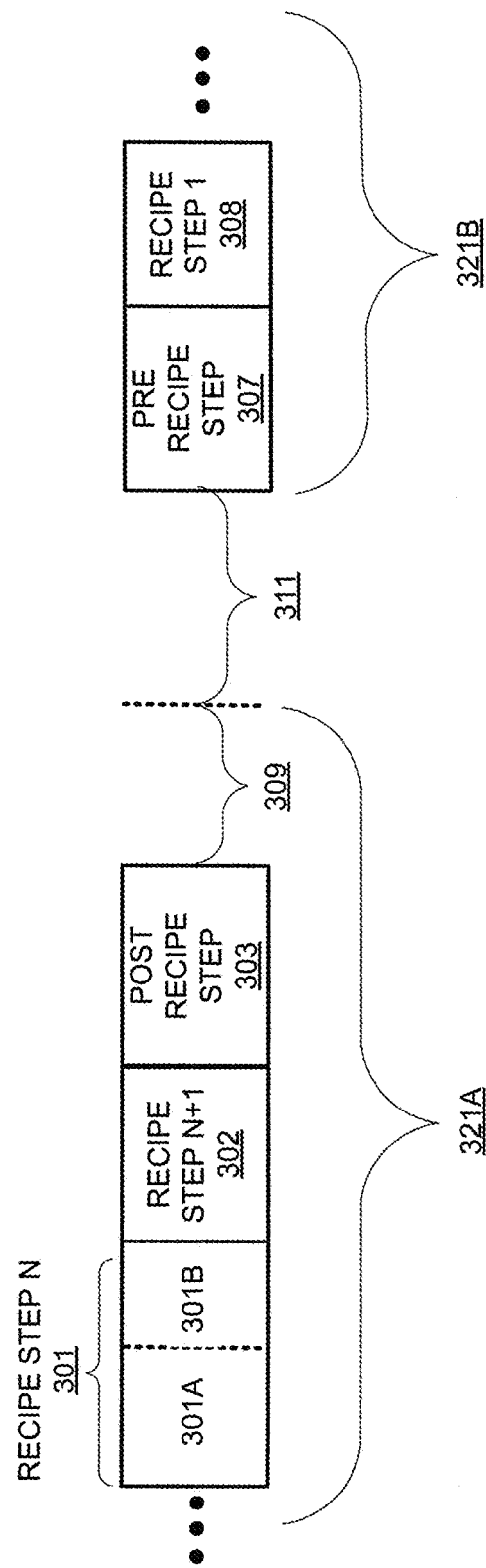
FIG. 3B is a block diagram illustrating particular segments in a plasma processing recipe executed during active states before and after an idle state, in accordance with an embodiment of the present invention

Returning to FIG. 3A, when in the system active state 321, the system operates in a recipe driven mode during which coolant and heater parameters from a recipe control algorithm may be executed on a time or processor cycle basis. FIG. 3B is a block diagram illustrating particular segments in a plasma processing recipe executed during active states 321A and 321B before and after an idle state 311, in accordance with an embodiment of the present invention. In the active state 321A, a plasma process recipe executing has a recipe step N (301) and a subsequent recipe step N+1 (302) which, for example, may be the last two plasma etch recipes steps of a continuous plasma process recipe during which plasma power is input into a plasma chamber. Unlike the idle state 311 which employs a feedback control algorithm such as that depicted in FIG. 4A, during execution of recipe step N (301) the coolant and heater control parameters are determined at least in part with a control algorithm, such as that depicted in FIG. 4B, which utilizes a feedforward signal. When the recipe step N+1 (302) is subsequently executed by the plasma processing system, the coolant and heater control parameters are similarly determined by a feedforward control algorithm (e.g., FIG. 4B). In the exemplary embodiment illustrated, the recipe step N (301) includes a first portion 301A and a second portion 301B which allow for a plurality of independent temperature control parameters (e.g., control gain groups for closed loop operation or duty cycle values for open loop operation) within the single recipe step N (301). The second portion 301B may be considered a "look-ahead" portion which allows for the an open loop set of temperature control parameters to be implemented before the duration of recipe step N (301) ends in preparation for the subsequent recipe step N+1 (302). Thus, upon entering the recipe step N (301), a closed loop gain group for the first portion 301A and open loop heater and/or coolant flow duty cycle value(s) for the second portion 301B may be determined from a database, lookup table, or the like. Such lookup tables may provide duty cycle values which are associated with particular plasma input powers.

As further depicted in FIG. 3B, the active state 321 may include a post-recipe step 303 in which closed or open loop control is continued after a plasma power is no longer input into the processing chamber (i.e. plasma processing completed). The post-recipe step 303 continues either closed loop or open loop temperature control for an extended period of time and may allow for a change in the setpoint temperature before a workpiece is unloaded from a processing chamber. During the post-recipe step 303, the minimum coolant fluid flow threshold is maintained during a substrate transfer until the next recipe starts. Similarly, the active state 321 may include a pre-recipe step 307 prior to performance of a first recipe step 308 in which plasma power is introduced for the first time in a process recipe. The pre-recipe step 307 allows closed or open loop control for an extended period of time which may allow for a change in the setpoint temperature before a workpiece is processed in a processing chamber.

During active state 321, a minimum coolant fluid flow threshold may be established to ensure the coolant flow is sufficiently high for a rapid temperature control response as may be required in subsequent recipe steps. With the coolant fluid flow maintained above the minimum coolant fluid flow threshold, a response delay which otherwise might result if coolant fluid stagnates may be avoided. For example, for a 90° C. setpoint, minimum duty cycle may be 15-20%. In one embodiment, the minimum coolant fluid flow threshold is a function of setpoint temperature 106 with a higher threshold for higher temperature setpoint.

Demarking the transition between active state 321 and idle state 311 is a delay time 309 before the idle state temperature control mode (e.g., FIG. 4A) is entered. If this delay time 309 is 0 seconds, then the system goes into idle control mode immediately after finishing a recipe. Otherwise, the actuator commands (e.g., the coolant flow and or heater power duty cycles) remain the same as was applied during the post recipe step 303. In certain embodiments, while in the idle state 311, coolant flow is completely shut off (i.e., duty cycle of 0%) further reducing heater power requirements and allowing the heater controller 391 to offset only ambient heat sinking during closed loop component temperature control.

Figure 3C:
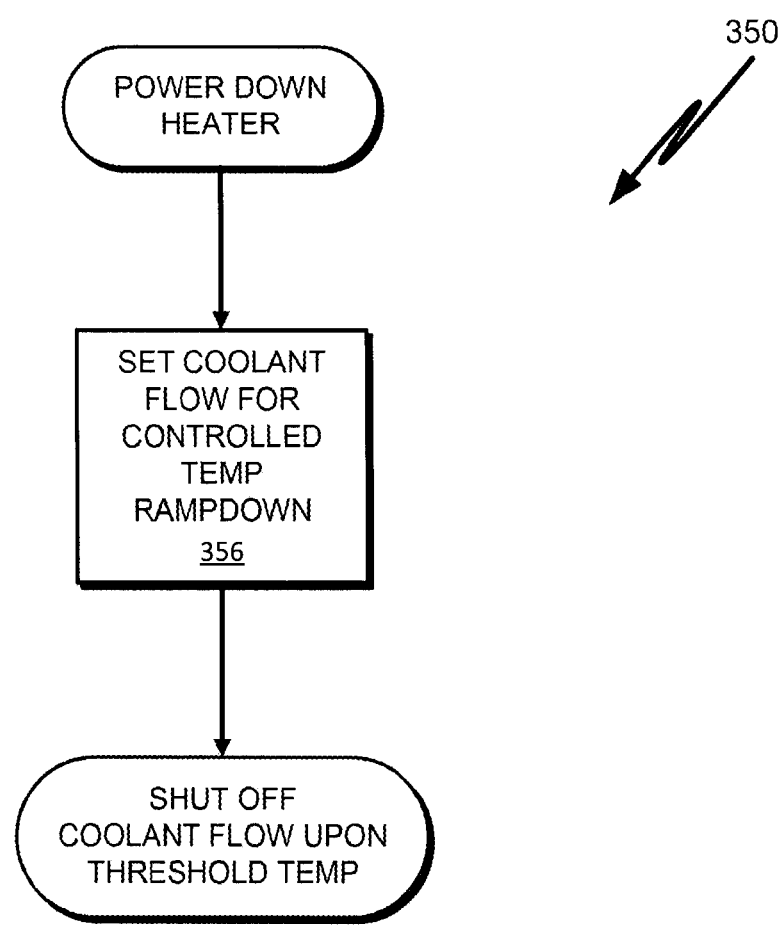
FIG. 3C is a flow diagram illustrating operations in a method for taking the control system described in FIG. 1 offline, in accordance with an embodiment of the present invention.

As further shown in FIG. 3C, upon the powering down the heater 390, temperature control may be taken offline automatically via method 350. For example when the chamber is taken offline for servicing, the temperature controller 375 automatically sets the coolant fluid flow rate to a predetermined "shutoff" value at operation 356 to ensure a controlled ramp down of the component temperature. A controlled ramp rate may be predetermined based on the component, for example for a showerhead having laminated structure may require a given rate to avoid warping and stress-induced delamination. At operation 356 the coolant fluid flows at the shutoff value until the temperature of component (e.g., inner or outer showerhead zone) reaches a threshold temperature or a threshold difference between the coolant fluid temperature and the component temperature, upon which the coolant fluid flow rate is stopped. For example, where the coolant fluid temperature is 20° C., a threshold difference between the coolant fluid temperature and a showerhead temperature is set to 10° C., and a coolant fluid shutoff duty cycle is 15%, coolant will flow through the showerhead at the 15% duty cycle until the temperature of showerhead (inner or outer) is less than 30° C. (20+10). Once the showerhead is less than 30° C., coolant fluid flow is stopped.

Referring back to FIG. 3A, in embodiments, a group of gain values including at least a feedforward control signal gain and a feedback control signal gain is determined by the temperature controller 375 based on at least the plasma power input into the chamber 305 for a current recipe step. In one such embodiment, a first group of gain values associated with a key value pairing of the plasma input power and the setpoint temperature is determined for the first portion 301A of the executing recipe step 301. FIG. 4C illustrates a gain group lookup table, in accordance with an embodiment of the present invention. As shown, setpoint temperature 486 is a first key value and plasma power input 485 is a second key value. Gain groups 1, 2, 3, etc. containing gain values for the various control signals in system 100 may be determined from the temperatures 486, plasma power inputs 485 or a pairing of the two corresponding to the conditions of the executing recipe step. The gain group may then be applied as further described elsewhere herein with reference to FIG. 4B.

To provide a faster transition to the subsequent recipe step N+1 (302), duty cycle values for the second portion 301B of the executing recipe step may be determined for either or both of the coolant control valve(s) 120 and the heater 390 upon initiating the recipe step N (301). As such, one or both of the heat source control loop 101 and heat sink control loop 102 may be placed into open loop control modes during the second portion 301B of the recipe step N (301). While the duration of the second portion 301B may be a fixed time, in a further embodiment, the duration of the second portion 301B is dependent on a change in the setpoint temperature and/or change in plasma power that is to occur between the currently executed recipe step N (301) and recipe step N+1 (302) to be subsequently executed.

In an embodiment where temperatures of the component 105 are changed between steps of an executing recipe (e.g., to help control polymer deposition), transient specific control parameters may be determined and communicated by the temperature controller 375. FIG. 4D illustrates a transient control period 494 for addressing changes in setpoint temperatures between two steps in a plasma process recipe, in accordance with an embodiment of the present invention. The recipe step N (301) and recipe step N+1 (302) are illustrated with the recipe step 492 along the x-axis and setpoint temperature 491 along the y-axis. In the depicted example, a plasma input power of 1000 W is applied during the recipe step N (301) while the setpoint temperature is 30° C. For the recipe step N+1 (302), 5000 W of plasma power is applied with a setpoint temperature of 50° C. In one embodiment where the duration of the transient control period 494 is dependent on a change in the setpoint temperature and/or change in plasma power, a transient response gain group (e.g., defining high gain values) is applied for an amount of time required to achieve a percentage of the change in setpoint temperature. For the example, in FIG. 4D, the transient control period 494 occurs for 90% of the 20° C. rise in temperature between step N (301) and step N+1 (302), or until the temperature reaches the threshold 493 (48° C.). As such, this transient group of gain values is applied for a duration which is longer when there is a greater change in setpoint temperature. A similar algorithm may be applied based on the magnitude of change in plasma power, for example increasing the duration of the transient control period 494 with greater changes in plasma power between steps. Alternatively, the transient control parameters may simply be applied for fixed time.

In an embodiment, transient response gain groups are associated with at least one of a change in plasma input power or a change in the setpoint temperature and may further be associated with a key value pairing a change in the plasma input power with a change in the setpoint temperature. FIG. 4E, for example, illustrates a lookup table for a transient gain group employed by the control transient control period 494 in FIG. 4D. As shown in FIG. 4E, a gain group is associated with changes of plasma input power 496 and changes of setpoint temperature 495.

In further embodiments, heater gain groups may also be determined for, and utilized, in the idle state 311. For example, a gain group may be determined from the lookup table illustrated in FIG. 4C during the idle state 311 as described for active state 321 when the heater controller 391 is in auto mode (e.g., during for the first recipe step portion 301A). Plasma power, which will be zero during the idle state 311, is paired with setpoint temperature to determine a gain group for a given idle state 311.

Figure 4B:
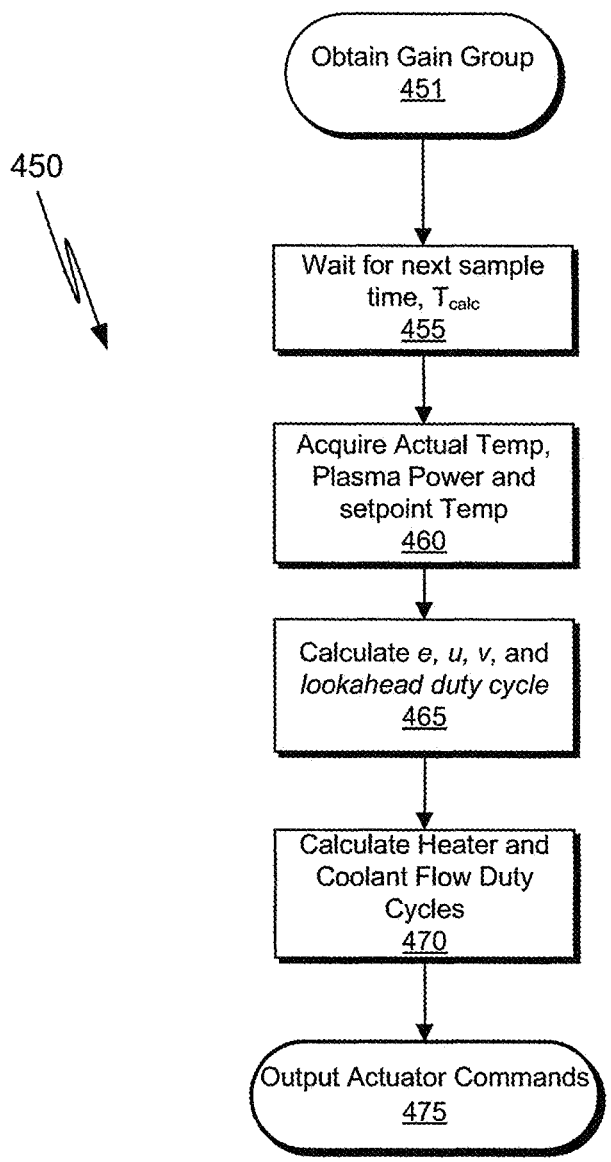
FIG. 4B is a flow diagram illustrating operations in a method for controlling a component temperature with the control system described in FIG. 1 during an active state, in accordance with an embodiment of the present invention.
Figure 4D:
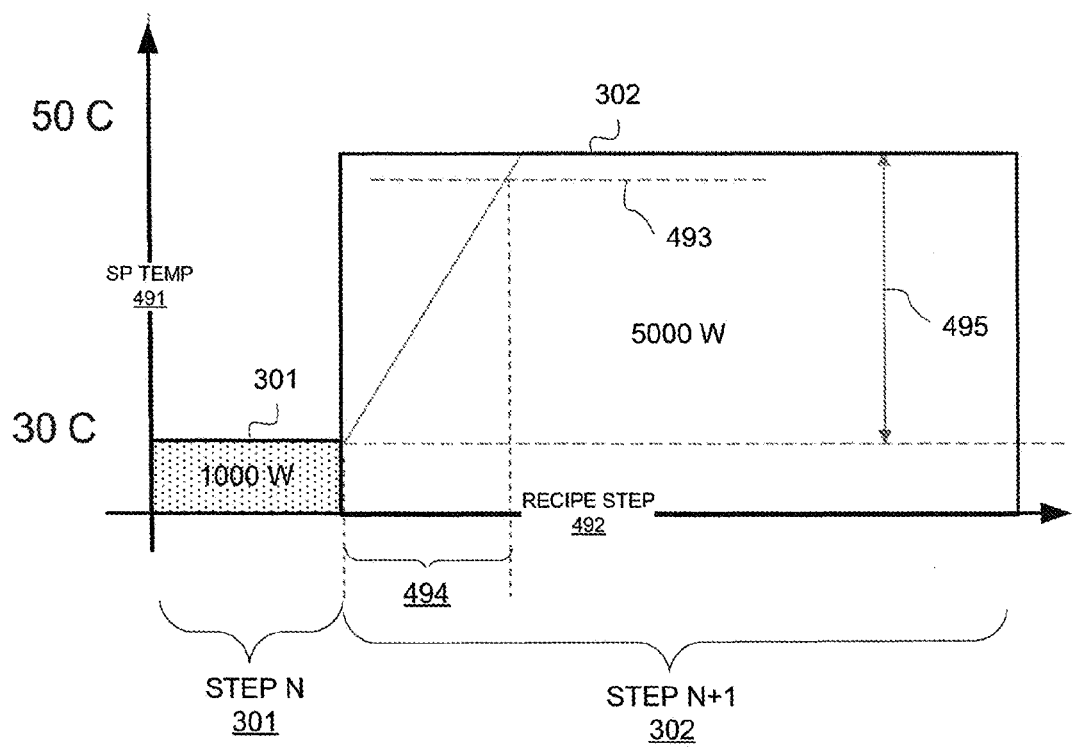
FIG. 4D illustrates a control algorithm for addressing changes in setpoint temperatures between two steps in a plasma process recipe, in accordance with an embodiment of the present invention.

FIG. 4B is a flow diagram illustrating operations in a method for controlling a component temperature with the control system described in FIG. 1 during an active state, in accordance with an embodiment of the present invention. The method 450 begins at operation 451 with determination of the gain group as well as any "look-ahead" details (duration of 301B, duty cycle values for coolant liquid flow valve(s) 120, duty cycles for either or both of the inner and outer resistive heater elements 378, 379). With the passage of a sample time $T_{calc}$ at operation 455, the current controlled temperature 150 (FIG. 1) is acquired, the setpoint temperature 106 is acquired, and the plasma input power is acquired at operation 460. A setpoint temperature for the heat sink may also be acquired. In the exemplary embodiment depicted in FIG. 2, the temperature controller 375 receives a controlled temperature input signal from showerhead sensors for inner and outer zones 364, 365. The temperature controller 375 acquires a setpoint temperature from a process recipe file, for example stored in the memory 373, and the temperature controller 375 acquires a setpoint or measured plasma power as described elsewhere herein.

In a preferred embodiment, a measured forward bias power 328 energizing a plasma in the process chamber 305 at the current time (e.g., after passage of $T_{calc}$) is input into the feedforward control line as a plasma heat load (e.g., Watts). Plasma power setpoint values (e.g., from a process recipe file stored in a memory 373) may also be utilized as an input to the feedforward control line. Such power setpoint values, being predefined, may enable the feedforward transfer function $F_A(s)$, and/or $F_B(s)$ to be evaluated for the power setpoint prior to application of plasma power or prior to a change in the application of plasma power into the system and generate an anticipatory control effort. However, assuming the temperature control system 100 can react sufficiently quickly, the plasma power input is preferably coupled to a measured power output signal for greater accuracy of the plasma power applied at current time. Even for such embodiments, control effort determinations for future time (e.g., recipe step N+1 (302)) would remain recipe-based.

In an embodiment, the plasma power input comprises a first bias power input to the chamber 305. For example, the plasma power input may be set equal to the plasma bias power 325 (FIG. 2A). For embodiments where the plasma processing system applies a plurality of bias power inputs to a chamber, the sum of the plurality of bias powers is input to the temperature control system 100. For example, in the exemplary embodiment depicted in FIG. 2A, a weighted sum of the plasma bias powers 325 and 326 are input. With the first and/or second, etc. plasma bias powers as the plasma power input, the feedforward transfer function $F_A(s)$, and/or $F_B(s)$ relates the bias power input (e.g., measured as forward bias power 328 output from RF match 327) to the feedforward control signal u defining a cooling effort to compensate the disturbance transfer function D(s).

Although in the exemplary embodiment the plasma power input p(s) is the sum of the bias powers, it should be noted that the determination of the feedforward control signal u may exclude one or more of the plasma power source. For example, referring to FIG. 2A, a high frequency plasma source power 330 may be excluded because the heat load placed on the showerhead 335 (or chuck 320) is relatively small. In alternative embodiments however, where the temperature to be controlled has an appreciable dependence on all plasma power input into a processing chamber, the feedforward control signal u output from the feedforward transfer function $F_A(s)$, and/or $F_B(s)$ may be further based on the plasma source power 330. For example, a power weighting function may be applied, such as c1*P1+c2*P2+c3*P3, as described elsewhere herein.

Returning to FIG. 4B, at operation 465, the feedforward control signal u, the temperature error signal ϵ (T-T$_{sp}$), the feedback control signal v, and the look-ahead duty cycles are computed at every T$_{calc}$ (e.g., by the CPU 372 executing the method 450 as an instance of temperature controller 375 stored in the memory 373). For the exemplary embodiment depicted in FIG. 2A having both an inner and an outer showerhead zone 364, 365, each of the feedforward control signal u, the temperature error signal ϵ, the feedback control signal v, and the look-ahead duty cycle is computed for each zone.

In the Laplace domain $$u(s)=F(s)p(s),$$

where u is the feedforward signal, F is the Feedforward transfer function and p is the plasma power. For the embodiment depicted in FIG. 2A, the feedforward control signal u may be implemented in discrete time domain as:

$$u(t) = \beta_o P(t) + \beta_1 P(t - T_{PWM}) + \beta_2 P(t - 2T_{PWM}) + \\ \ldots \alpha_1 u(t - T_{PWM}) + \alpha_2 u(t - 2T_{PWM}) + \alpha_3 u(t - 3T_{PWM}) + \ldots$$

where P(t) is the plasma power input at the current T$_{calc}$, and where T$_{PWM}$ is a time increment of the PWM driver 380, 393. In a particular embodiment, feedforward control signal u is computed as simply β$_o$P(t) to be based on the plasma power input at the current time (e.g., T$_{calc}$).

In a further embodiment, because the plasma power to be requested in future time periods is determinable (e.g., from the process recipe file), the feedforward expression further includes the terms θ$_1$P(t+T$_{PWM}$)+θ$_2$P(t+2T$_{PWM}$) to compensate for lag in the effect of the coolant flow on the controlled temperature. In another embodiment, the heat transfer required to achieve the controlled temperature 150 is dependent on the heat sink (e.g., chiller 377) setpoint temperature and/or heat source (e.g., heat exchanger 378') setpoint temperature such that the additional coolant temperature dependent term δ$_c$(T$_{SP}$−T$_{heat\,sink}$)+δ$_h$(T$_{SP}$−T$_{heat\,source}$) added to the feedforward control signal u, where T$_{SP}$ is the controlled temperature 150. Each of δ$_c$ and δ$_h$ may be defined as a polynomial function of the temperature difference between the setpoint and the heat sink/heat source. For example, in one embodiment δ$_c$=a$_0$+a$_1$(T$_{SP}$−T$_{heat\,sink}$)+a$_2$(T$_{SP}$−T$_{heat\,sink}$)$^2$+a$_3$(T$_{SP}$−T$_{heat\,sink}$)$^3$ with δ$_h$ taking a similar form. The entire feedforward equation can also have factors for temperature dependence, Ω$_{hot}$ and Ω$_{cold}$ such that the net feedforward control signal u becomes:

$$u(t) = \Omega_{hot}(T_{SP} - T_{heat\,soure})\Omega_{cold}(T_{SP} - T_{heat\,sink}) \\ \{\beta_o P(t) + \beta_1 P(t - T_{PWM}) + \beta_2 P(t - 2T_{PWM}) + \ldots \alpha_1 u(t - T_{PWM}) + \\ \alpha_2 u(t - 2T_{PWM}) + \alpha_3 u(t - 3T_{PWM}) + \ldots \theta_1 P(t + T_{PWM}) + \\ \theta_2 P(t + 2T_{PWM}) + \delta_c(T_{SP} - T_{heat\,sink}) + \delta_h(T_{SP} - T_{heat\,source})\}.$$

Similarly, the feedback control signal v is v(t)=G(s)ϵ(s) in the Laplace domain and may be implemented in discrete time domain as:

$$v(t) = \lambda_0 e(t) + \lambda_1 e(t - T_{PWM}) + \lambda_2 P(t - 2T_{PWM}) + \\ \ldots \eta_1 v(t - T_{PWM}) + \eta_2 v(t - 2T_{PWM}) + \eta_3 v(t - 3T_{PWM}) + \ldots$$

where ϵ(t) is the temperature error signal (difference between controlled temperature 150 and setpoint temperature 106) at T$_{calc}$. In a particular embodiment, feedback control signal v is computed as simply λ$_o$ e(t). While the operation 465 is performed every T$_{calc}$, the control computations are to use input temperatures and plasma power values input at some lower frequency corresponding to times t, t-T$_{PWM}$, etc., Values for the parameters of u, v, plasma power (P), controlled temperature 150, and setpoint temperature 106 may be stored in a data array and those stored values corresponding to the discrete times of t, t-T$_{PWM}$ may then be utilized in subsequent control calculations.

For recipe steps employing the second portion 301B to provide look-ahead open loop control, the look-ahead duty cycle is determined from for a lookup table, database, etc., as described elsewhere herein. At operation 470, a control actuator output signal p (e.g., duty cycle) is determined for each of the heater 390 and coolant flow coolant liquid flow valve(s) 120 and then output to the actuator at operation 475.

In one embodiment, a constant gain K$_v$ (e.g., one of the gains making up a gain group in FIG. 4C) is applied to the feedforward control signal u and a constant gain K$_u$ is applied to the feedback control signal v such that the control actuator output signal ρ is calculated as ρ(t)=K$_v$v−K$_u$u. The gain groups containing K$_v$, K$_u$ provide a system operator a simple interface to access the combined feedforward and feedback control line in two simple factors for each of the heat source control loop 101 and heat sink control loop 102. Depending on the value of the control actuator output signal ρ, heat transfer between one or more of a heat sink and heat source is modulated. In exemplary embodiment of FIG. 2A therefore, where the control actuator output signal ρ is of a first sign (e.g., ρ<0), the controlled temperature 150 may be reduced via a command provided by the temperature controller 375 in a form executable by the PWM driver 380 or 393 to increase the duty cycle of the valve(s) 120 and increase the heat transfer between the chiller 377 and the showerhead 335 while the heater 390 reduces the duty cycle of the resistive heating elements 378 and/or 379. This situation would be typical for a recipe step in which plasma power is on or a setpoint temperature has been reduced.

Where the control actuator output signal ρ is of a second sign (e.g., ρ>0), the controlled temperature 150 may be increased via a command provided by the temperature controller 375 in a form executable by the PWM driver 380 or PWM driver 393 to reduce the duty cycle of the valve(s) 120 and reduce the heat transfer between the chiller 377 and the showerhead 335 while the duty cycle of the resistive heating elements 378 and/or 379 is increased. For example, where a recipe step in which plasma power is reduced from a previous level (e.g., turned off) or where a setpoint temperature is decreased while the total plasma power is constant, ρ changes from a more negative number to a less negative number, then the coolant flow from chiller 377 is reduced by decreasing the duty cycle of valve(s) 120. In particular embodiments, while a heating power input to heat the chamber component is increased, a coolant liquid flow between the process chamber and a heat sink external to the process chamber is reduced to a flow rate of zero in response to the feedback signal v. Thus, in certain embodiments, a complete stoppage of the coolant fluid to the temperature-controlled component (e.g., showerhead 335) may occur in response to the component temperature being below the setpoint temperature during either the idle state 311 or active state 321. During the active state 321, this capability allows for faster transient response times and higher possible operating temperatures while in the idle state 311, less heater power is wasted. In other embodiments, complete stoppage of the coolant fluid to the temperature-controlled component (e.g., showerhead 335) occurs in response to the component temperature being below the setpoint temperature during only the idle state 311 with a minimum coolant fluid flow threshold limiting the coolant fluid to a non-zero value, as described elsewhere herein.

For the exemplary embodiment depicted in FIG. 2A, the presence of the inner and outer zones 364 and 365 is complicated by the two zones having in common the single coolant loop 376. In a particular embodiment, with the control actuator control signal ρ calculated independently for all heater zones, the control actuator command determination may include logic to handle conditions where a computation for the first zone (e.g., inner zone 364) determines a coolant fluid duty cycle different from that computed for the second zone (e.g., outer zone 365). For example, thresholds may be established for differences in the duty cycles determined for each of the coolant liquid flow and heater powers and/or conditions for the separate zones combined as a Boolean OR such that the coolant flow duty cycle may default to a non-zero flow value even if one zone requires heating. In the exemplary embodiment depicted in FIG. 2A, if $\rho_{inner}$ and $\rho_{outer}$>0, coolant duty cycle is non-zero and heater duty cycles=0. If $\rho_{inner}$>0 and $\rho_{outer}$<0, then cool inner and heat outer (coolant will flow through both zones for exemplary embodiment with common cooling loop shared between inner and outer zones 364, 365). If $\rho_{inner}$<0 and $\rho_{outer}$>0, then inner zone 364 is heated and outer zone 365 is cooled (coolant will flow through both zones for exemplary embodiment with common cooling loop shared between inner and outer zones 364, 365). If $\rho_{inner}$<0 and $\rho_{outer}$<0, then inner and outer zones 364, 365 are heated (coolant fluid flow duty cycle=0).

In a particular embodiment, with the control actuator control signal ρ calculated independently for all heater zones, the duty cycle of coolant liquid passing through all heater zones (e.g., inner and outer zones 364, 365) is a determined as a function of a maximum duty cycle between the heater zones, a minimum duty cycle between the heater zones, a duty cycle of the inner zone 364, and a duty cycle of the outer zone 365. For example, the coolant liquid duty cycle may be determined as:

$$\text{CoolantGain}*\text{abs}(\text{dutycycle}_{inner}*\rho_{inner}+\text{dutycycle}_{outer}*\rho_{outer}+\text{dutycycle}_{max}*\max(\rho_{inner},\rho_{outer})+\text{dutycycle}_{min}*\min(\rho_{inner},\rho_{outer})),$$

where CoolantGain is a factor to amplify or attenuate ρ and $\text{dutycycle}_{inner}$, $\text{dutycycle}_{outer}$, $\text{dutycycle}_{max}$, and $\text{dutycycle}_{min}$ are correction factors for the coolant duty cycle based on the heater power for the particular zone.

It is therefore possible under certain circumstances that both heating power and coolant fluid flow is non-zero (e.g., in the case where zones 364 and 365 are disturbed differently or have significantly different setpoint temperatures 106). For example, where the inner zone 364 (first zone) needs heating to reach a higher setpoint while the outer zone 365 (second zone) is to be cooled to reach a lower setpoint temperature, then coolant flow would be based on the outer zone 365 that requires cooling with extra heating applied to inner zone 364 to overcome the coolant flowing the first zone. A such, the inner and outer zone heater duty cycles may be determined as:

$$\text{HeaterDutyCycle}_{inner}=\text{HeaterGain}_{inner}*\text{abs}(\rho_{inner});$$

and $$\text{HeaterDutyCycle}_{outer}=\text{HeaterGain}_{outer}*\text{abs}(\rho_{outer})*\text{correction2}_{outer}*\rho_{inner}^2+\text{correction1}_{outer}*\rho_{inner}+\text{correction0}_{outer},$$

where HeaterGain is a factor to amplify or attenuate ρ for a particular heater zone.

Figure 5:
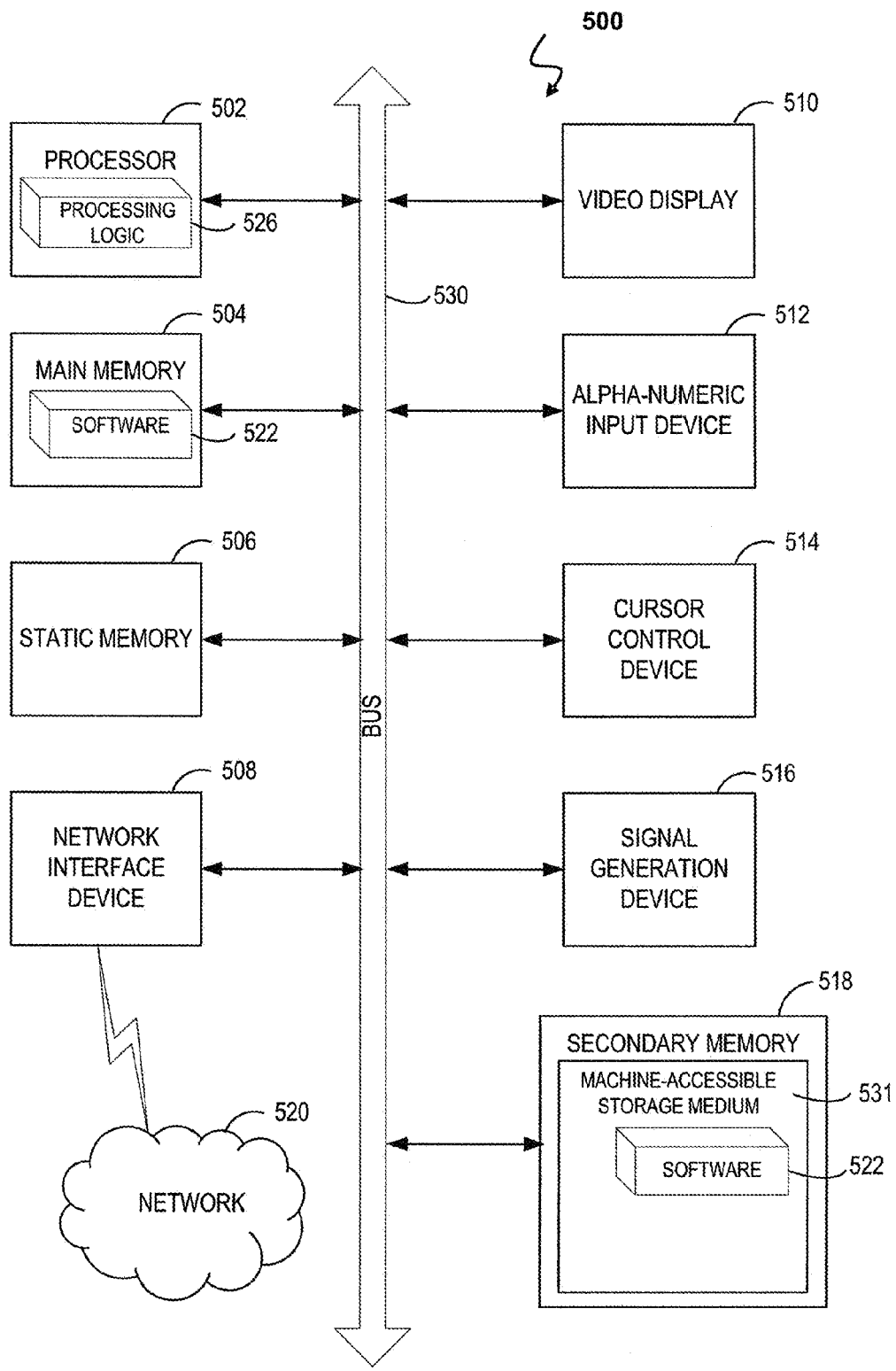
FIG. 5 illustrates a block diagram of an exemplary computer system incorporated into the plasma etch system depicted in FIG. 2A, in accordance with one embodiment of the present invention.

FIG. 5 illustrates a diagrammatic representation of a machine in the exemplary form of a computer system 500 which may be utilized to perform the temperature control operations described herein. In one embodiment, the computer system 500 may be provisioned as the controller 370 in the plasma etch system 300. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

The processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. The processor 502 may also be one or more special-purpose processing devices such as an application specific integrated circuit (ASIC), a field programmable gate array (FPGA), a digital signal processor (DSP), network processor, or the like. The processor 502 is configured to execute the processing logic 526 for performing the temperature control operations discussed elsewhere herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a non-transitory computer-readable storage medium) 531 on which is stored one or more sets of instructions (e.g., software 522) embodying any one or more of the temperature control algorithms described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

The machine-accessible storage medium 531 may further be used to store a set of instructions for execution by a processing system and that cause the system to perform any one or more of the temperature control algorithms described herein. Embodiments of the present invention may further be provided as a computer program product, or software, which may include a machine-readable medium having stored thereon instructions, which may be used to program a computer system (or other electronic devices) to control a plasma processing chamber temperature according to the present invention as described elsewhere herein. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, and flash memory devices, etc.

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A method for controlling a plasma process chamber component temperature, the method comprising:
   generating a feedback signal indicating the chamber component temperature is below a setpoint temperature; and
   reducing a coolant liquid flow between a process chamber and a heat sink external to the process chamber to a flow rate of zero in response to the feedback signal.

2. The method of claim 1, further comprising:
   determining a plasma power input to the process chamber when the chamber is in an active state executing a plasma process recipe; and
   controlling the coolant liquid flow with a feedforward control signal based on the input plasma power.

3. The method of claim 2, further comprising:
   controlling a heating power input to the chamber component with a feedforward control signal based on the input plasma power.

4. The method of claim 3, wherein controlling the coolant liquid flow and the heating power input further comprises applying a first group of gain values during a first portion of an executing step in the plasma process recipe, the first group of gain values associated with a key value pairing of the plasma input power and the setpoint temperature for the executing recipe step, wherein the gain value group includes at least a feedforward control signal gain and a feedback control signal gain.

5. The method of claim 4, wherein controlling the coolant liquid flow and the heating power input further comprises applying a group of transient gain values during a second portion of the executing recipe step, the group of transient gain values associated with a key value pairing of a change in the plasma input power and a change in the setpoint temperature between the executing step and a subsequent plasma process recipe step.

6. The method of claim 5, wherein the group of transient gain values are applied for a duration dependent on the chamber component temperature and the change in the setpoint temperature.

7. The method of claim 4, wherein controlling the coolant liquid flow and the heating power input further comprises determining a coolant liquid flow duty cycle or a heating power input from a look up table during a second portion of the executing recipe step.

8. The method of claim 2, further comprising:
   setting the liquid coolant flow rate based on a lookup table value in response to the component temperature crossing a threshold level when the chamber is in an idle state.

9. The method of claim 1, further comprising setting the coolant liquid flow to a non-zero value in response to a heater power input to the chamber component being reduced to zero.

10. The method of claim 5, wherein the plasma power comprises a first bias power input to a chuck configured to support a workpiece and wherein the feedforward control signal comprises a transfer function between the bias power input and the showerhead temperature.

11. The method of claim 1, wherein controlling the coolant liquid flow further comprises modulating a pulse width modulation duty cycle to fully open and fully close a valve through which the coolant liquid flows, and wherein the controlling of coolant liquid flow is constrained to a non-zero minimum flow rate while the chamber is in an active state.

12. A computer readable media with instructions stored thereon, which when executed by a processing system, cause the system to perform the method of claim 1.

13. A plasma processing apparatus, comprising:
   a plasma power source coupled to a process chamber to energize a plasma during processing of a workpiece disposed in the process chamber;
   the process chamber including a temperature-controlled component coupled to a heat sink by a coolant liquid loop, the coolant liquid loop including a coolant liquid control valve which completely stops the coolant liquid flow to the temperature-controlled component; and
   a temperature controller coupled to the coolant liquid control valve to control a heat transfer between the temperature-controlled component and the heat sink by varying the coolant liquid flow rate over a range including zero liquid flow.

14. The apparatus of claim 13, wherein the temperature controller includes a feedforward control line for control of the coolant liquid control valve, wherein the temperature controller is communicatively coupled to the plasma power source, and wherein a feedforward control signal is based on a plasma power input to energizing the plasma.

15. The apparatus of claim 13, wherein the temperature-controlled component is further coupled to a heat source and wherein the temperature controller is to coordinate with the coolant liquid flow a control of the heat transfer between the heat source and the temperature-controlled component.

16. The apparatus of claim 15, further comprising a heater controller communicatively coupled to the temperature controller, wherein the heater controller is coupled to a resistive heating element driver and the coolant liquid control valve to control both the heating power and the cooling power in response to commands received from the temperature controller.

17. The apparatus of claim 13, wherein the temperature-controlled component is a process gas showerhead and wherein the coolant loop passes through a coolant channel embedded in the showerhead.

18. The apparatus of claim 17, wherein m independently controlled heating elements are embedded within the showerhead, wherein the coolant loop is one of n coolant loops embedded in the showerhead, and m is not equal to n.

19. The apparatus of claim 13, wherein the temperature controller is communicatively coupled to the plasma power source and wherein the feedforward control signal is based on a plasma power input acquired from the plasma power source.

20. The apparatus of claim 19, wherein the feedforward control signal is to compensate a plasma heating of the temperature-controlled component.

21. The apparatus of claim 19, wherein the temperature controller is to modulate a pulse width modulation duty cycle to fully open and fully close a valve through which the coolant liquid flows.

* * * * *